United States Patent [19]

Menu

[11] Patent Number: 5,750,188

[45] Date of Patent: May 12, 1998

[54] METHOD FOR FORMING A THIN FILM OF A NON-STOICHIOMETRIC METAL OXIDE

[75] Inventor: Eric P. Menu, Mesa, Ariz.

[73] Assignee: Motorola, Inc., Schaumburg, Ill.

[21] Appl. No.: 705,361

[22] Filed: Aug. 29, 1996

[51] Int. Cl.$^6$ .................................... B05D 5/13
[52] U.S. Cl. ............. 427/126.3; 427/162; 427/248.1; 427/376.2
[58] Field of Search ................. 427/126.3, 162, 427/248.1, 376.2

[56] References Cited

U.S. PATENT DOCUMENTS

| | | | |
|---|---|---|---|
| 3,636,919 | 1/1972 | Bozler | 118/48 |
| 3,731,353 | 5/1973 | Vecht | 29/25.13 |
| 3,775,173 | 11/1973 | Yamamoto et al. | 117/201 |
| 3,844,636 | 10/1974 | Maricle | 350/160 |
| 3,957,352 | 5/1976 | Leibowitz | 350/160 R |
| 4,223,049 | 9/1980 | Murray et al. | 427/126 |
| 4,418,118 | 11/1983 | Lindors | 428/336 |
| 4,534,099 | 8/1985 | Howe | 29/572 |
| 5,318,723 | 6/1994 | Hashemi | 252/518 |
| 5,508,368 | 4/1996 | Knapp et al. | 427/534 |

OTHER PUBLICATIONS

"Preparation of ZnO Thin-Film Transducers by Vapor Transport" by Roger F. Belt and Gerald C. Florio; *Journal of Applied Physics* vol. 39, No. 11, Oct. 1968, pp. 5215–5223.

*Primary Examiner*—Benjamin Utech
*Attorney, Agent, or Firm*—Kathleen Anne Tobin; Eugene A. Parsons

[57] ABSTRACT

A method for forming a thin film (220) of luminescent zinc oxide includes the steps of: (i) providing a mixture (170) of powdered zinc oxide and powdered graphite, (ii) providing a substrate (140) at a distance of about 9 millimeters from the mixture (170), (iii) disposing the mixture (170) and substrate (140) within an apparatus (100) that provides a confined environment having a partial pressure of oxygen of about 0.21 atmospheres, (iv) heating the mixture (170) to a temperature of about 850 degrees Celsius, and (v) establishing a temperature gradient between the substrate (140) and the mixture (170) of about 15 degrees, the temperature of the substrate (140) being less than the temperature of the mixture (170).

22 Claims, 2 Drawing Sheets

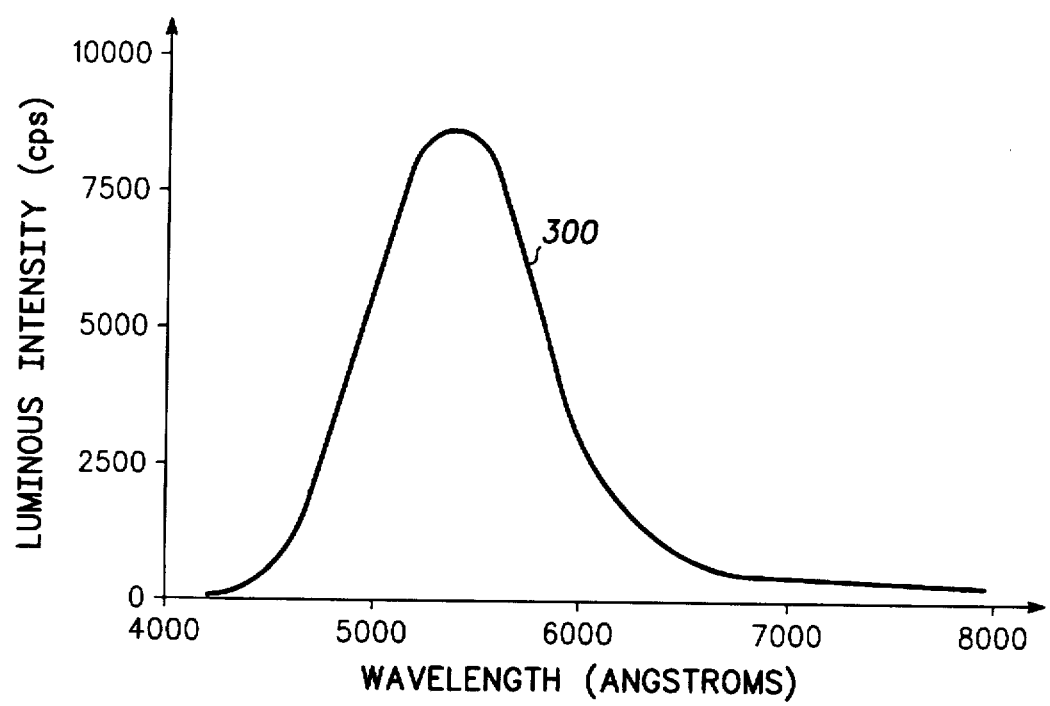
FIG. 2
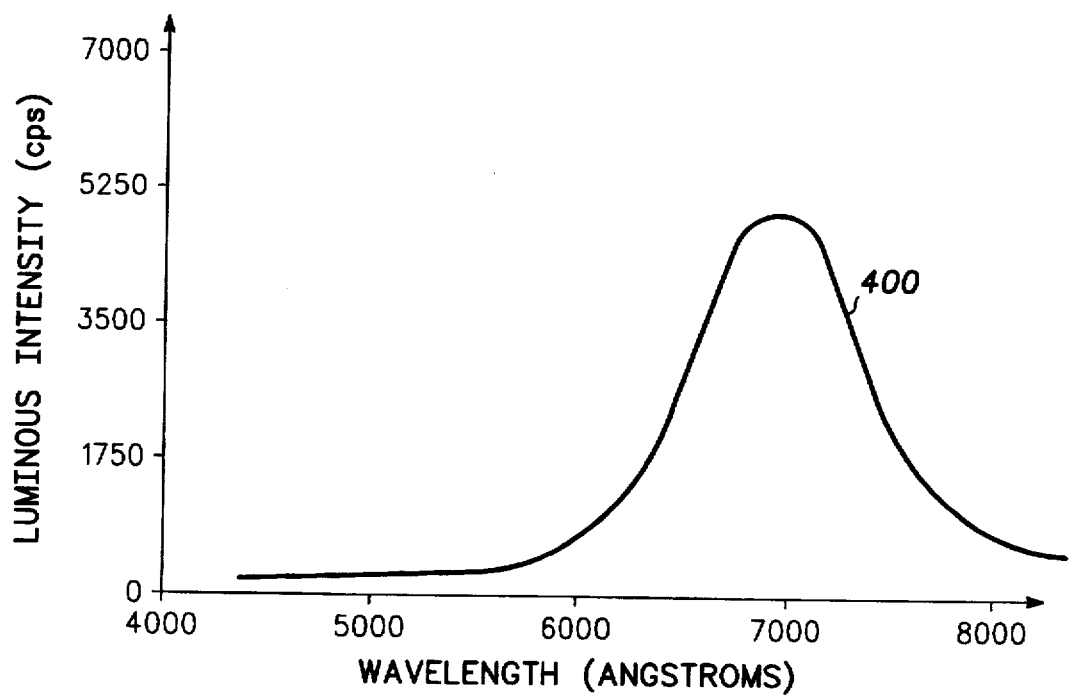
FIG. 3 - PRIOR ART -

5,750,188

1

METHOD FOR FORMING A THIN FILM OF A NON-STOICHIOMETRIC METAL OXIDE

FIELD OF THE INVENTION

The present invention pertains to a method for forming a thin film of a non-stoichiometric metal oxide and, more specifically, to a method for forming a thin film of luminescent zinc oxide suitable for use in a field emission display.

BACKGROUND OF THE INVENTION

Certain metal oxides are known to be thermodynamically stable in a nonstoichiometric form which also have found practical applications in the arts. For example, zinc oxide, in a non-stoichiometric state including an of excess of zinc and a deficiency of oxygen, is known in the art as a luminescent material which has found use in displays. In a typical process for forming a luminescent layer of zinc oxide, non-luminescent zinc oxide powder is first activated by annealing, thereby transforming it into a luminescent form. It is then deposited on the surface of a transparent substrate, such as glass. The annealing of the powder is performed at temperatures in excess of 800 degrees Celsius. The annealing step generates the intrinsic solid state defects which are responsible for the efficient luminescence of the characteristic blue-green light upon excitation by ultraviolet or electron irradiation. The zinc oxide retains its powdery state subsequent the annealing step. Several disadvantages are inherent in the use of a powdered form of zinc oxide for luminescent displays. The grain size of the powder, which dictates the ultimate minimum surface roughness, may be too large for small scale, high resolution applications, such as field emission displays. Additionally, the adhesion of zinc oxide powder grains to substrates is often weak. This results in the deterioration of the luminescent layer when submitted to vibrations or electrical fields.

In other schemes, powdered zinc oxide is mixed with a binder in an attempt to improve adhesion to substrates. This scheme has the disadvantage of requiring an additional processing step for burning off the binder material.

Another approach involves deposition of a layer of zinc oxide by common deposition techniques, such as sputtering and chemical vapor deposition. However, to generate the luminescent form, an additional post-deposition annealing step is required.

Thus, there exists a need for a method for forming a thin layer of zinc oxide which is luminescent and which has smooth surface morphology.

BRIEF DESCRIPTION OF THE DRAWINGS

FIG. 2 is a graphical representation of luminous intensity versus wavelength for a thin film of luminescent zinc oxide grown by a method in accordance with the present invention.

FIG. 3 is a graphical representation of luminous intensity versus wavelength for a layer of prior art, unannealed, powdered zinc oxide.

DESCRIPTION OF THE PREFERRED EMBODIMENT

Figure 1:
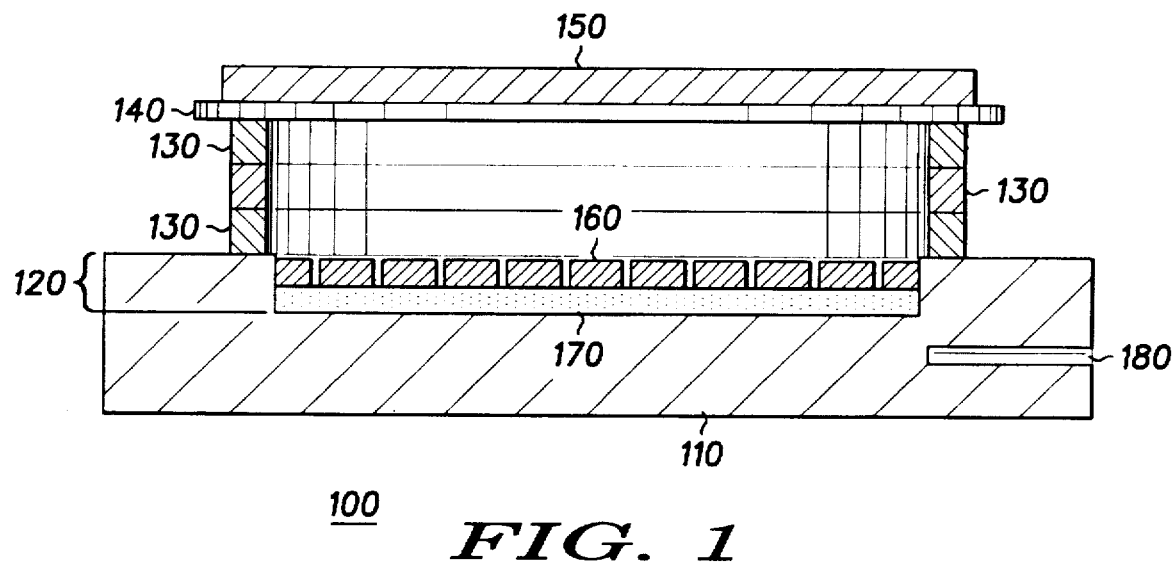
FIG. 1 is a cross-sectional view an apparatus suitable for use in performing various steps of an embodiment of a method for forming a thin film of a non-stoichiometric metal oxide in accordance with the present invention.

Referring now to FIG. 1, there is depicted a cross-sectional view of an apparatus 100 suitable for use in performing various steps of an embodiment of a method for forming a thin film of a non-stoichiometric metal oxide in accordance with the present invention. In the discussion below, the actual formation of a thin film of luminescent zinc oxide will be described. Contrasted with a layer of powder, a thin film provides smooth morphology and good adherence to substrates. A luminescent thin film of zinc oxide was produced by an embodiment of a method in accordance with the present invention. The thin film provided smooth morphology and good adherence to substrates, a distinct advantage over the prior art powdered form of luminescent zinc oxide. Zinc oxide is luminescent when near-surface defects are introduced into the crystal. When used in displays, such as field emission displays, the surface of the zinc oxide must also be conductive to prevent the accumulation of electrical charge due to electron bombardment. The requirements of near-surface defects and surface conductivity are satisfied by introducing zinc interstitials and oxygen vacancies at, and near, the surface. The oxygen vacancies provide the luminescent property; the excess zinc provides surface conductivity. These defects were formed within a film of zinc oxide deposited by a method for forming a thin film of luminescent zinc oxide in accordance with the present invention. When the layer of zinc oxide is grown according to a method in accordance with the present invention, the conductivity of the resultant film is adequate so that the film may be used in a display; no post-deposition treatment is required to enhance conductivity. Apparatus 100 was used to conduct a close-spaced vapor transport of ZnO to form a nonstoichiometric, electrically conductive layer of luminescent zinc oxide. Apparatus 100 includes a susceptor 110 made from pure graphite. Susceptor 110 may be made from any high-temperature, inert material. Susceptor 110 includes a recess 120 which was made by drilling into a slab of pure graphite to a depth of 5 millimeters deep and to provide a 1.5" diameter. A plurality of thin rings 130 were stacked on susceptor 110 in registration with recess 120. Rings 130 were also made from graphite and had diameters larger than the diameter of recess 120. Rings 130 may alternatively be made from or any suitable high-temperature, inert material. Rings 130 supported a substrate 140 which was placed face down directly on rings 130. Alternatively, substrate 140 may be mounted on a graphite template which conforms to the shape of substrate 140. Substrate 140 was made of sapphire. Substrate 140 may be made from a hard material capable of withstanding the high temperature conditions (within the range of about 700–1000 degrees Celsius) of the present method. Such materials include, but are not limited to, sapphire, quartz, silicon, molybdenum, and mica. A heat sink 150 was placed on the outer surface of substrate 140. Heat sink 150 includes thin slabs of a suitable material, such as a ceramic or silicon, and is utilized to cool substrate 140. Non-luminescent zinc oxide powder and graphite powder, which are readily available from chemical suppliers, were mixed and finely ground by using a mortar and pestle to produce a finely ground mixture 170. The ratio of graphite to zinc oxide within mixture 170 may be adjusted to control the deposition rate of the film. A graphite to zinc oxide ratio of 1:1 was used in the present example. In general, the graphite may be present within a range of 20–80% by volume of mixture 170. Mixture 170 was spread uniformly at the bottom of recess 120 and then covered by a diffuser 160. Diffuser 160 includes a thin disk of graphite having a diameter slightly less than the diameter of recess 120 so that it may be lain on mixture 170. Diffuser 160 includes a plurality of small holes drilled therein. In this particular example, diffuser 160 included about 60 holes drilled through it, uniformly over its surface. Each hole had a diameter of about 1 mm. Diffuser 160 is utilized to control the mass transport area, thereby reducing the transport rate and controlling the growth rate of the luminescent zinc oxide film at substrate 140. A suitable temperature gradient which provides the desired rate of transport of metal and oxygen from mixture 170 to substrate 140 is provided, in part, by establishing a predetermined distance between mixture 170 and substrate 140. This distance is within a range of 1–10 millimeters and is provided by using a suitable number of rings 130. In this particular example, rings 130 were each about 3 millimeters tall. Three of rings 130 were employed to provide a distance of about 9 millimeters between mixture 170 and substrate 140. The distance between mixture 170 and substrate 140 must be large enough to establish a temperature gradient, necessary for the gaseous transport, and small enough to provide adequate concentration of the reactive species at substrate 140. Apparatus 100 was then loaded into a horizontal quartz chamber/reactor. The quartz chamber had an external RF coil for uniformly heating its contents. A temperature probe was inserted in a recess 180 within susceptor 110. Then, apparatus 100 was uniformly heated by the RF coil of the reactor. Alternatively, the temperatures of mixture 170 and substrate 140 may be adjusted independently from one another by, for example, using two independent heat sources: one controlling the temperature of mixture 170, and the other controlling the temperature of substrate 140. This may be achieved, for example, by employing two IR lamps and two thermocouples to monitor and control temperature. In this particular example, apparatus 100 was heated to provide a thermocouple reading, at mixture 170, of about 850 degrees Celsius. The atmosphere employed within the quartz chamber was ambient air, which contains a partial pressure of oxygen of about 0.21 atmospheres. This was done by having an opening in the quartz chamber which is open to the ambient air. Apparatus 100 was assembled in air, so that the gas within it was also air. Apparatus 100 provides a confined environment wherein the gas within apparatus 100 is stagnant, and no forced gas flow was introduced within it. The confined environment need not be hermetically sealed, but it does prevent convective gas flow and sudden changes in the conditions of the gas. Because apparatus 100 was not leakproof, diffusion of air was able to occur from the interior of the quartz chamber into apparatus 100. In other embodiments of the present invention, the apparatus providing the confined environment is made leak-proof or is hermetically sealed from the external environment. In this particular example, no holes were formed in the elements of apparatus 100, or distinctive gaps allowed in their configuration. However, fluid communication, via gas leaks, existed between the interior of apparatus 100 and the interior of the quartz chamber. At mixture 170 oxygen is consumed by reaction with graphite to produce carbon monoxide, thereby creating a reducing environment at the surface of mixture 170. At substrate 140, however, the oxygen is not consumed by carbon and is, thus, available for oxidizing Zn. The oxidation reaction is also favored at substrate 140 due to the lower temperature there. Heating was provided to maintain the temperature reading from the temperature probe adjacent mixture 170 within a range of 850–880 degrees Celsius, for this particular example. The temperature of mixture 170 needs to be high enough to promote production of a suitable concentration of carbon monoxide for reducing the metal oxide, and also needs to be suitable for promoting the reduction of the metal oxide to produce a gaseous transport species of the metal. Heat sink 150 provides the heat conduction which establishes a temperature gradient so that the temperature at substrate 140 is less than the temperature of mixture 170. Due to the small distance between mixture 170 and substrate 140, additional, or different, cooling means may be operably coupled to substrate 140 for maintaining a suitable temperature at substrate 140. In this particular example, the temperature difference between mixture 170 and substrate 140 is believed to have been about 10–15 degrees. The gradient may be adjusted over time in order to control the growth rate and properties of the film. For example, it is preferred to begin the growth at a small temperature gradient of about 5 degrees, during the initial nucleation stage. This initial small gradient establishes a high concentration of nucleation sites during the beginning phase of growth, which favors the growth of a single crystal thin film or the growth of a fine polycrystalline thin film. A finely grained layer comprises a smooth film. Typical layers of zinc oxide powders of the prior art cannot achieve grain sizes having characteristic dimensions less than about 0.5 micrometers. However, pixels in a high-definition display, for example, will conceivably have dimensions on the order of 1 micrometer. Standard powder grain sizes are therefore far too large for use in such high-definition displays. Luminescent films of zinc oxide grown by a method in accordance with the present invention can include grain sizes having characteristic dimensions below 0.1 micrometers. These films are therefore suitable for use in such high-definition displays. After the initial stage of growth, the gradient may be increased to increase the deposition rate. In the formation of luminescent ZnO films suitable for use in displays, it is preferable to form small grains, having a characteristic dimension of less than 0.5 micrometers. The temperature of mixture 170 was about 850 degrees Celsius, which is suitable to promote the production of an adequate concentration of CO for the reduction of the ZnO. The system is a reducing transport system. This temperature also results in a suitable rate of reaction for the formation of the gaseous transport species, $Zn(g)$ and $CO_2(g)$. It is believed that at substrate 140 zinc is oxidized by carbon dioxide. A temperature gradient is established between substrate 140 and mixture 170 which is within a range of about 5 to 50 degrees Celsius, the temperature at substrate 140 being less than the temperature at mixture 170. The temperature at substrate 140 is low enough to promote the oxidation of gaseous zinc and the condensation of the ZnO onto substrate 140. The oxygen from the gas phase within the quartz reactor reacts with the carbon of the graphite to produce carbon monoxide and carbon dioxide. At the high temperature conditions of the system, these reactions exhibit equilibria which are displaced toward the production of the carbon monoxide. The presence of the graphite is critical for the production of the carbon monoxide, which reacts with the metal oxide to form the gaseous transport species of the metal oxide. Since recess 120 forms a confined, albeit nonhermetically sealed, environment, little exchange with the outside is possible, and most of the free oxygen within recess 120 is consumed. Then, carbon monoxide reduces the ZnO powder to produce gaseous zinc and carbon dioxide. The gaseous zinc, the transport species of the metal, and carbon dioxide, the transport species of the oxygen, are then transported by diffusion through the gas phase to the surface of substrate 140. Near the surface of substrate 140, the lower temperature causes the gas phase at that location to become supersaturated with zinc and carbon dioxide. At this lower temperature the oxidation of the zinc and the condensation of ZnO occur, wherein the gaseous zinc reacts with the carbon dioxide to form zinc oxide which then deposits on substrate 140. This reaction functions to regenerate carbon monoxide which can participate again in the reduction of zinc oxide powder at mixture 170. Because of the high reactivity of graphite with oxygen at the high temperature at mixture 170, part of the oxygen from the ZnO powder does not become reincorporated into the ZnO thin film, thereby creating oxygen vacancies and zinc interstitials within the film and thereby producing the non-stoichiometry of the film. Contrary to most vapor deposition processes, no foreign agent is needed to carry out the transport of the zinc. Furthermore, the transport is not passive, but operates in a reactive mode wherein carbon monoxide serves the dual function of reducing zinc oxide and generating the transporting agent for oxygen, carbon dioxide. The parameters which can be manipulated to change reaction rates, mass transport rates, and deposition rates include: the temperature of mixture 170, the temperature of substrate 140, the thermal gradient between substrate 140 and mixture 170, the distance between mixture 170 and substrate 140, gas pressure within apparatus 100, and gas chemistry, such as the partial pressure of oxygen within apparatus 100. It may be desirable to increase the temperature of substrate 140 above 850 degrees Celsius to, for example, control the characteristics of the defects within the deposited film. This requires that the temperature at mixture 170 be higher than 850 degrees Celsius, to provide the temperature gradient. At these higher temperatures, the thermodynamic equilibrium at mixture 170 cannot be maintained if the gas phase in apparatus 100 includes air at one atmosphere. To approach thermodynamic equilibrium at mixture 170 at these higher temperatures, the partial pressure of oxygen within apparatus 100 is increased. In this manner, the zinc oxide film is formed at temperatures above about 850 degrees Celsius via a near-equilibrium process. Ambient air (about 21 molar percent oxygen) is suitable for mixture temperatures up to about 850 degrees Celsius. If the initial gas conditions within apparatus 100 include one atmosphere of pure oxygen, however, the temperature can be increased by up to 50 degrees, to about 900 degrees Celsius, and still maintain near-equilibrium conditions. Near-equilibrium conditions are established to maintain adequate control over the deposition process. If apparatus 100 is not gas-tight, the same pressure and oxygen conditions are provided within the quartz chamber. The present method in accordance with the present invention does not require a post-deposition activation, or annealing, step in order to transform the zinc oxide into its luminescent form; the required surface defects are generated during the deposition of the thin film. As is known to one skilled in the art, in order to impart luminescence to ZnO, the zinc oxide requires an excess of zinc within a range of about 100 to 200 parts per million, as well as a deficiency of oxygen. This non-stoichiometry is required at the film surface in order to exhibit luminescence therein upon bombardment by low-energy electrons or upon excitation by UV radiation. The conditions of the present example—including an ambient air atmosphere as well as mixture and substrate temperatures of about 850 and 835 degrees Celsius, respectively—yielded an adequate concentration of excess zinc within the film to impart the desired luminescence, as will be described in greater detail with reference to FIG. 2. Other combinations of these, and/or other, adjustable variables will be suitable for providing an adequate defect concentration to impart luminescence to the film. The luminescent film grown by this particular example was grown at a rate of about 0.5 micrometers per hour. A suitable range for the growth rate to produce a luminescent film is believed to be within 0.1–1 micrometers per hour.

In other embodiments of the present method, one or more additional species may be added to the mixture of graphite and metal oxide. These species may comprise dopants or activators useful for imparting to the film desired characteristics, such as enhanced electrical conductivity or emission wavelength. Alternatively, these additional species may include other chemical elements to form ternary oxide alloys. One example of a dopant which can be mixed into the graphite/metal oxide mixture is CoO having a gaseous transport species which is Co. The dopants must yield a gaseous transport species to transport the dopant to the film at a desired rate so that a predetermined concentration of the dopant results within the deposited film. The rate of transport and the dopant concentration within the film can be controlled by, for example, adjusting the relative amount of the dopant mixed into the graphite/metal oxide mixture.

A method for forming a thin film of a non-stoichiometric metal oxide in accordance with the present invention can be applied to the formation of thin films of metal oxides other than zinc oxide. Metal oxides suitable for use in a method in accordance with the present invention fulfill the following four criteria: (1) the metal oxide can be reduced by carbon monoxide or carbon dioxide, (2) the product(s) of the reduction reaction between the CO or $CO_2$ and the powdered metal oxide are gaseous species which are capable of being transported in the gas phase from the graphite/metal oxide mixture to the major surface of the deposition substrate, (3) the metal oxide is not contaminated by carbon, and (4) the metal oxide in the solid mixture retains its solid state at the high temperatures required for the formation of carbon monoxide or carbon dioxide. It is believed that tin oxide, for example, is such a suitable metal oxide for use in the present method. Similar to zinc oxide, tin oxide is known to be thermodynamically stable in a non-stoichiometric form which has found utility in the arts. For example, thin films of $SnO_2$ are known to be useful as a phosphor for cathodoluminescence. The steps comprising these other embodiments of the present method for the deposition of other metal oxides are analogous to those described above with reference to zinc oxide and FIG. 1. In these other embodiments of the present method, the temperature at substrate 140 is established to promote the oxidation reaction of the metal and to provide supersaturated conditions so that the metal oxide condenses onto substrate 140. Means for controlling the temperature at substrate 140 may include conductive or convective cooling. Additionally, the thermodynamics of a suitable metal oxide may require that the temperature at the mixture be less than about 600 degrees Celsius, within a range of 400–600 degrees Celsius. At these temperatures, the reaction between the oxygen and graphite will favor the production of carbon dioxide so that the concentration of CO is very low. In these instances, the primary reducing agent is carbon dioxide. At temperatures above 600 degrees Celsius, such as are used in the deposition of ZnO according to the present method, the reaction of the oxygen with the graphite favors the production of CO, instead. In these instances, the primary reducing agent is CO. It is believed that the high reactivity of the graphite with oxygen at the high temperature conditions will result in a nonstoichiometric metal oxide film at substrate 140, thereby forming a film having metal interstitials and oxygen vacancies. Tin oxide is readily available from chemical vendors in a powdered form, which can be mixed with powdered graphite, in the manner described above with reference to zinc oxide.

The method in accordance with the present invention is also easily scaleable, requires little equipment, and is low cost, thereby conferring some of the benefits inherent in the use of powders. The present method provides the additional benefits of forming a film of the metal oxide which has smooth morphology and good adhesion to substrates, benefits which are not realized from the use of powders.

Referring now to FIGS. 2 and 3, there are depicted graphical representations 300 and 400, respectively, of luminous intensity upon ultra-violet excitation of a thin film of zinc oxide (FIG. 2) deposited on sapphire in accordance with the example described with reference to FIG. 1, and of a layer of unannealed, prior art zinc oxide powder (FIG. 3), which is used in mixture 170 (FIG. 1). The thin film of zinc oxide, formed in accordance with the example discussed in detail with reference to FIG. 1, exhibited a maximum luminous intensity (FIG. 2) which peaked at around 5500 Angstroms (blue-green color), whereas the luminescence of the unannealed powder, when similarly tested, peaked (FIG. 3) at around 6980 Angstroms (red-orange color). The luminescence (FIG. 2) of the thin film of zinc oxide, which was realized by the present method, satisfies the luminescence requirements of low voltage field emission displays, which will be described in greater detail below, with reference to FIG. 4.

Figure 4:
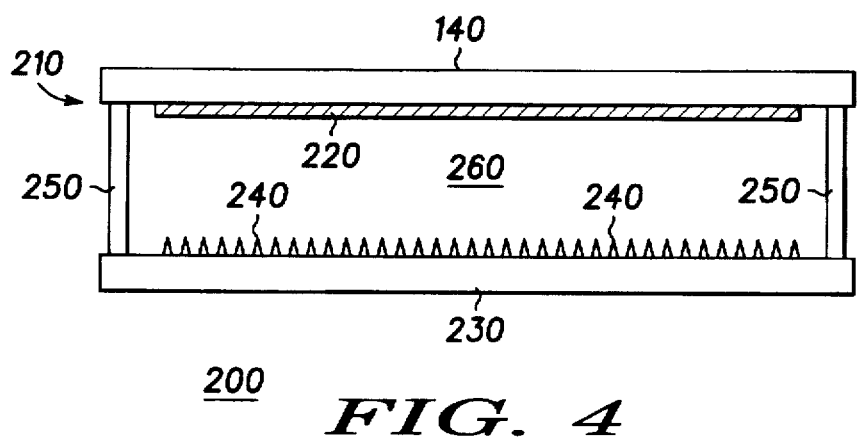
FIG. 4 is a cross-sectional view of an embodiment of a field emission display in accordance with the present invention.

Referring now to FIG. 4, there is depicted a cross-sectional, schematic view of a field emission display (FED) 200 in accordance with the present invention. FED 200 employs a thin film 220 of luminescent zinc oxide formed in the manner described above with reference to FIG. 1, in accordance with the present invention. FED 200 includes a face plate 210. Face plate 210 includes substrate 140 made from a transparent material capable of withstanding the high-temperature substrate requirements as described with reference to FIG. 1. Suitable transparent, high temperature materials for substrate 140 include sapphire and quartz. Thin film 220 is formed on a major surface of substrate 140. Thin film 220 is grown to a thickness within a range of about 0.1–3 micrometers, preferably one micrometer. In this particular embodiment, thin film 220 is continuous over the major surface of substrate 140; in other embodiments the ZnO comprises segments of film formed on portions of the major surface. The patterning may be achieved by, for example, depositing a patterned lift-off layer on the major surface of substrate 140 prior to the deposition of thin film 220 of luminescent zinc oxide. The pattern of the lift-off layer defines the portions of the major surface of substrate 140 which are not to have ZnO deposited thereon. The film of ZnO is then deposited in the manner described with reference to FIG. 1. Subsequent the zinc oxide deposition, the lift-off material is selectively removed from the major surface of substrate 140, thereby also removing the zinc oxide deposited on the lift-off material so that only a predetermined pattern of zinc oxide remains on the major surface of substrate 140. The predetermined pattern of the ZnO film is dictated by factors such as the configuration of the electronic scheme used to address a plurality of selectively addressable field emitters 240. Field emitters 240 are formed in a major surface of a cathode display plate 230, which opposes face plate 210 to define a predetermined spacing therebetween. A frame 250 provides standoff between face plate 210 and cathode display plate 230 at their peripheries. Frame 250 is hermetically sealed to face plate 210 and cathode display plate 230 to provide an interspace region 260. Interspace region 260 is evacuated to a pressure of less than or equal to about $1 \times 10^{-6}$ Torr. Luminescent thin film 220 is useful within FED 200 having a potential difference between cathode display plate 230 and face plate 210 that is within a range of about 50–500 volts. Displays operating within this range of voltages are typically referred to as low voltage displays. Zinc oxide is a favored low voltage luminescent material because it exhibits suitable luminescence and good conductivity at these operating conditions. During the operation of FED 200, electrons are emitted by field emitters 240. The electrons traverse interspace region 260 and are received by thin film 220, thereby causing light to be emitted by the luminescent zinc oxide of thin film 220. The light travels through transparent face plate 210, thereby forming a visual image.

While I have shown and described specific embodiments of the present invention, further modifications and improvements will occur to those skilled in the art. I desire it to be understood, therefore, that this invention is not limited to the particular forms shown, and I intend in the appended claims to cover all modifications that do not depart from the spirit and scope of this invention.

What is claimed is:

1. A method for forming a thin film of a non-stoichiometric metal oxide including the steps of:
   providing a mixture including powdered graphite and a powdered metal oxide, the powdered graphite 20–80% by volume of the mixture;
   providing a substrate made from a material capable of withstanding high temperatures and having a surface, disposing said mixture and the surface of said substrate within a confined environment, the surface of the substrate being spaced from said mixture by a distance;
   heating the mixture to a first temperature within 400–1000 degrees Celsius;
   providing within the confined environment a partial pressure of oxygen, the first temperature of the mixture and the partial pressure of oxygen forming a reducing environment, the reducing environment forming a gaseous transport species of the metal;
   maintaining the surface of the substrate at a second temperature, the second temperature being less than the first temperature thereby defining a temperature gradient between the surface of the substrate and the mixture; and
   controlling the temperature gradient to provide transport of the gaseous transport species of the metal from the mixture to the substrate.

2. A method for forming a thin film of a non-stoichiometric metal oxide as claimed in claim 1 wherein the first temperature of the mixture is 400–600 degrees Celsius so that the formation of the reducing environment includes the reaction of oxygen with graphite to form carbon monoxide.

3. A method for forming a thin film of a non-stoichiometric metal oxide as claimed in claim 1 wherein the first temperature of the mixture is 600–1000 degrees Celsius so that the formation of the reducing environment includes the reaction of oxygen with graphite to form carbon dioxide.

4. A method for forming a thin film of a non-stoichiometric metal oxide as claimed in claim 1 wherein the temperature gradient between the surface of the substrate and the mixture is within 5–50 degrees.

5. A method for forming a thin film of a non-stoichiometric metal oxide as claimed in claim 1 wherein the distance between the major surface of the substrate and the mixture is within 1–10 millimeters.

6. A method for forming a thin film of a non-stoichiometric metal oxide as claimed in claim 1 wherein the partial pressure of oxygen within the confined environment is within 0.2–2 atmospheres.

7. A method for forming a thin film of a non-stoichiometric metal oxide as claimed in claim 1 wherein the partial pressure of oxygen is about 0.21 atmospheres.

8. A method for forming a thin film of a non-stoichiometric metal oxide as claimed in claim 1 wherein the metal oxide includes zinc oxide.

9. A method for forming a thin film of a non-stoichiometric metal oxide as claimed in claim 1 wherein the metal oxide includes tin oxide.

10. A method for forming a thin film of a non-stoichiometric metal oxide as claimed in claim 1 wherein the grain size of the thin film is within the range of 0.05–0.5 microns.

11. A method for forming a thin film of a non-stoichiometric metal oxide as claimed in claim 10 wherein an initial temperature gradient between the mixture and the surface of the substrate within the range of 5–10 degrees is established.

12. A method for forming a thin film of a non-stoichiometric metal oxide as claimed in claim 1 wherein the substrate is selected from the group consisting of sapphire, quartz, silicon, molybdenum, and mica.

13. A method for forming a thin film of a non-stoichiometric metal oxide as claimed in claim 1 wherein the mixture further includes a dopant.

14. A method for forming a thin film of luminescent zinc oxide including the steps of:

providing a mixture including powdered graphite and powdered zinc oxide, the powdered graphite being 20–80% by volume of the mixture;

providing a substrate made from a material capable of withstanding high temperatures and having a surface, disposing said mixture and the surface of said substrate within a confined environment, the surface of the substrate being spaced from said mixture by a distance;

heating the mixture to a first temperature within 700–1000 degrees Celsius;

providing within the confined environment a partial pressure of oxygen, the first temperature of the mixture and the partial pressure of oxygen forming carbon monoxide, thereby providing a reducing environment forming a gaseous transport species of zinc;

maintaining the surface of the substrate at a second temperature, the second temperature being less than the first temperature thereby defining a temperature gradient between the surface of the substrate and the mixture; and controlling the temperature gradient to provide transport of the gaseous transport species of the zinc from the mixture to the substrate.

15. A method for forming a thin film of luminescent zinc oxide as claimed in claim 14 wherein the temperature gradient between the surface of the substrate and the mixture is within the range of 5–50 degrees.

16. A method for forming a thin film of luminescent zinc oxide as claimed in claim 14 wherein the distance between the major surface of the substrate and the mixture is within the range of 1–10 millimeters.

17. A method for forming a thin film of luminescent zinc oxide as claimed in claim 14 wherein the partial pressure of oxygen within the confined environment is within the range of 0.2–2 atmospheres.

18. A method for forming a thin film of a luminescent zinc oxide as claimed in claim 14 wherein the partial pressure of oxygen is about 0.21 atmospheres.

19. A method for forming a thin film of a luminescent zinc oxide as claimed in claim 14 wherein the grain size of the thin film is within the range of 0.05–0.5 microns.

20. A method for forming a thin film of a luminescent zinc oxide as claimed in claim 19 wherein an initial temperature gradient between the mixture and the surface of the substrate within the range of 5–10 degrees is established.

21. A method for forming a thin film of a luminescent zinc oxide as claimed in claim 14 wherein the substrate is selected from the group consisting of sapphire, quartz, silicon, molybdenum, and mica.

22. A method for forming a thin film of luminescent zinc oxide as claimed in claim 14 wherein the mixture further includes a dopant.

* * * * *